United States Patent
Naiki et al.

(10) Patent No.: US 8,188,209 B2
(45) Date of Patent: *May 29, 2012

(54) POLYIMIDE RESIN AND CURABLE RESIN COMPOSITION

(75) Inventors: Masahiro Naiki, Yamaguchi (JP); Ryoichi Takasawa, Yamaguchi (JP); Shuichi Maeda, Yamaguchi (JP); Tetsuji Hirano, Yamaguchi (JP); Masayuki Kinouchi, Yamaguchi (JP)

(73) Assignee: Ube Industries, Ltd., Ube-shi, Yamaguchi (JP)

( * ) Notice: Subject to any disclaimer, the term of this patent is extended or adjusted under 35 U.S.C. 154(b) by 699 days.

This patent is subject to a terminal disclaimer.

(21) Appl. No.: 11/884,348

(22) PCT Filed: Mar. 28, 2006

(86) PCT No.: PCT/JP2006/007016
§ 371 (c)(1),
(2), (4) Date: Aug. 15, 2007

(87) PCT Pub. No.: WO2006/104243
PCT Pub. Date: Oct. 5, 2006

(65) Prior Publication Data
US 2010/0113689 A1    May 6, 2010

(30) Foreign Application Priority Data

Mar. 28, 2005 (JP) ................... 2005-091908

(51) Int. Cl.
C08G 73/10 (2006.01)
C08L 33/24 (2006.01)

(52) U.S. Cl. .......... 528/85; 528/353; 528/370; 525/408; 525/423; 525/424; 525/425; 525/433; 525/434; 525/440.06; 525/454; 525/459; 525/457

(58) Field of Classification Search .............. 528/85, 528/322, 84, 353
See application file for complete search history.

(56) References Cited

U.S. PATENT DOCUMENTS 5,097,010 A * 3/1992 Markle et al. .......... 528/390
2004/0236059 A1* 11/2004 Piqueras et al. .......... 528/76

FOREIGN PATENT DOCUMENTS

| JP | 07330856 A | * | 12/1995 |
| JP | 08-253677 | | 10/1996 |
| JP | 2001-240650 | | 9/2001 |
| JP | 2002-145981 | | 5/2002 |
| JP | 2003-335944 | | 11/2003 |

(Continued)

OTHER PUBLICATIONS

International Search Report of International Application No. PCT/JP2006/307016, dated Jun. 20, 2006.
International Preliminary Report on Patentability mailed Oct. 11, 2007 for PCT International Application No. PCT/JP2006/307016 filed Mar. 28, 2006 and Written Opinion of the International Searching Authority dated Jun. 20, 2006.

(Continued)

Primary Examiner — Randy Gulakowski
Assistant Examiner — Rachel Kahn
(74) Attorney, Agent, or Firm — Nixon Peabody LLP; Jeffrey L. Costellia

(57) ABSTRACT

A curable polyimide resin composition containing a polyimide resin obtainable from by a reaction of a reaction mixture containing a diisocyanate compound, a carbonate group-containing diol compound and an imide compound having two terminal hydroxyhydrocarbyl groups gives a cured insulation film having improved characteristics.

10 Claims, 2 Drawing Sheets

FOREIGN PATENT DOCUMENTS

| | | |
|---|---|---|
| JP | 2004-079415 | 3/2004 |
| JP | 2004-211064 | 7/2004 |
| JP | 2005-002192 | 1/2005 |
| JP | 2005-036025 | 2/2005 |
| JP | 2006-104462 | 4/2006 |

OTHER PUBLICATIONS

Japanese Office Action, Patent Application No. 2006-088251, Sep. 30, 2011, pp. 1-3 English translation, pp. 4-6 Japanese original.

* cited by examiner

POLYIMIDE RESIN AND CURABLE RESIN COMPOSITION

FIELD OF THE INVENTION

The present invention relates to a polyimide resin and a curable resin composition containing the same. Particularly, the invention relates to a modified polyimide resin which is favorably employable for manufacture of an insulation film (such as a protective film, a solder resist, or an interlayer insulation film) of an electric-electronic device.

BACKGROUND OF THE INVENTION

For manufacturing a protective insulation film of a flexible printed circuit board, polyimide resin, polyurethane resin, polyamideimide resin or epoxy resin is generally employed. These resins are utilized in the form of a curable resin composition, if necessary, after addition of a curable compound.

The protective insulation film preferably has high flexibility, high bendability and low warping property in addition to high heat resistance, high resistance to chemical materials, and high resistance to solvents.

U.S. Pat. No. 6,335,417 B1 describes a modified polyimide resin which can give an article having high heat resistance, good pliability, and low warping property. The modified polyimide resin comprises recurring units composed of polyimide units containing polybutadiene moiety and units of residue derived from a diisocyanate.

JP-A-11-12500 describes a curable modified polyamide-imide resin having a carbonate bonding.

JP-A-2002-145981 describes a curable modified polyimide resin having a carbonate bonding. The modified polyimide resin described in this publication is prepared by reacting a diisocyanate compound having a carbonate bonding in its main skeleton and a tetracarboxylic acid dianhydride.

The present inventors have noted that the curable modified polyamideimide resin having an amide bonding (which is described in JP-A-11-12500) shows a relatively high hygroscopicity. The high hygroscopicity causes decrease of insulation property of an insulation film of the modified polyamideimide resin formed on an electronic device.

According to the study of the present inventors, the modified polyimide resin having a carbonate bonding described in JP-A-2002-145981 shows a limited solubility in organic solvents. Further, an insulation film produced of the modified polyimide resin does not show satisfactory resistance under high temperature-high humidity conditions.

SUMMARY OF THE INVENTION

It is an object of the present invention to provide a modified polyimide resin which is well soluble in organic solvents and can give an insulation film such as a protective film, a solder resist, or an interlayer insulation film of an electric-electronic device, which has high heat resistance, high flexibility, low warping property (or low curling property), good adhesion to molding material, high resistance to chemical materials, high resistance to soldering, and high resistance to solvents.

It is another object of the invention to provide a curable polyimide resin composition which can give an insulation film such as a protective film, a solder resist, or an interlayer insulation film of an electric-electronic device, which has high heat resistance, high flexibility, low warping property (or low curling property), good sealing property, high resistance to chemical materials, high resistance to soldering, and high resistance to solvents.

It has been discovered by the present inventors that the solubility of the polyimide resin having a carbonate bonding can be prominently improved by incorporating a divalent aliphatic or aromatic hydrocarbon group, particularly a divalent aliphatic hydrocarbon group, into the polyimide resin between its polyimide moiety and its isocyanate moiety. The incorporation of a divalent aliphatic or aromatic hydrocarbon group between the polyimide moiety and isocyanate moiety of the polyimide resin can be done by initially preparing a carbonate compound having two terminal isocyanate groups by the reaction of a carbonate-containing diol compound (i.e., a carbonate compound having two terminal hydroxyl groups) and a diisocyanate compound, and an imide compound having two terminal hydroxyhydrocarbyl groups, separately, and then reacting the carbonate compound having two terminal isocyanate groups with the imide compound having two terminal hydroxyhydrocarbyl groups. It is further discovered that use of a diol compound having a reactive polar group in combination with the carbonate-containing diol compound is effective to improve film characteristics of a film produced employing the resulting modified polyimide resin.

Accordingly, the present invention resides in a polyimide resin comprising the following recurring units (1), (2) and (3):

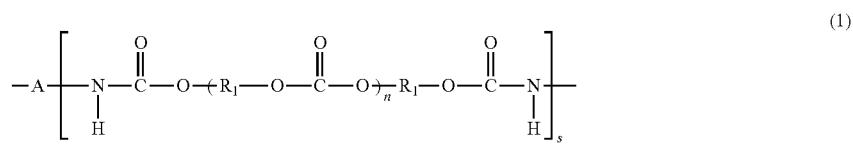

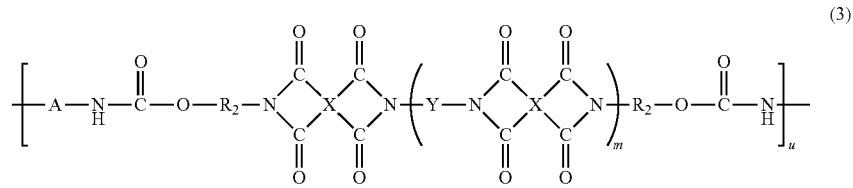

in which A is a divalent residue obtainable from a diisocyanate compound by removing two isocyanate groups thereof; W is a divalent residue obtainable from a diol compound having a reactive polar group by removing two hydroxyl groups thereof; each of $R_1$ and $R_2$ independently is a divalent aliphatic or aromatic hydrocarbon group; X is a tetravalent residue obtainable from a tetracarboxylic acid compound by removing all carboxyl groups thereof; Y is a divalent group obtainable from a diamine compound by removing two amino groups thereof; n is an integer of 1 to 40, m is an integer of 0 to 20, each of s and u independently is an integer of 1 to 100, and t is an integer of 0 to 100.

The present invention further resides in a method for preparing a polyimide resin of the invention comprising the aforementioned recurring units (1), (2) and (3) which comprises reacting a diisocyanate compound of the formula (4) and an imide compound of the formula (5):

having a carbonate bonding in its skeleton (i.e., carbonate bonding-containing diol compound).

The diisocyanate compound can be any diisocyanate such as an aliphatic diisocyanate, an alicyclic diisocyanate or an aromatic diisocyanate. The diisocyanate preferably contains 2 to 30 carbon atoms excluding carbon atoms contained in the isocyanate groups. Examples of the diisocyanate compounds include 1,4-tetramethylene diisocyanate, 1,5-pentamethylene diisocyanate, 1,6-hexamethylene diisocyanate, 2,2,4-trimethyl-1,6-hexamethylene diisocyanate, lysine diisocyanate, 3-isocyanate methyl-3,5,5-trimethylcyclohexylisocyanate (i.e., isophorone diisocyanate), 1,3-bis(isocyanate methyl)cyclohexane, 4,4'-dicyclohexylmethane diisocyanate, tolylene diisocyanate, 4,4'-diphenylmethane diisocyanate, 1,5-naphthalene diisocyanate, toluidine diisocyanate, and xylylene diisocyanate.

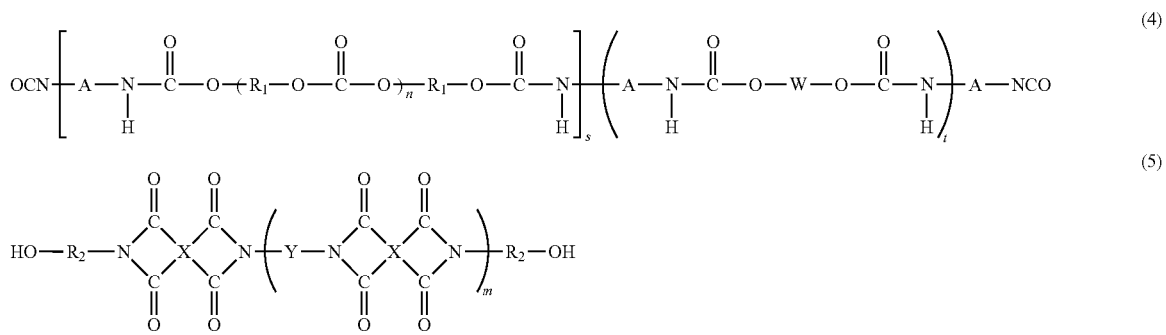

in which each of A, W, $R_1$, $R_2$, n, s and t has the same meaning as defined above.

The present invention furthermore resides in a curable polyimide resin composition comprising 100 weight parts of the polyimide resin of the invention, 1 to 50 weight parts of an epoxy compound and/or 1 to 50 weight parts of an isocyanate compound, and an organic solvent.

The present invention furthermore resides in a cured insulation film manufactured by heating a solution film of the polyimide resin composition which comprises 100 weight parts of the polyimide resin of the invention, 1 to 50 weight parts of an epoxy compound and/or 1 to 50 weight parts of an isocyanate compound, and an organic solvent.

DETAILED DESCRIPTION OF THE INVENTION

Figure 1:
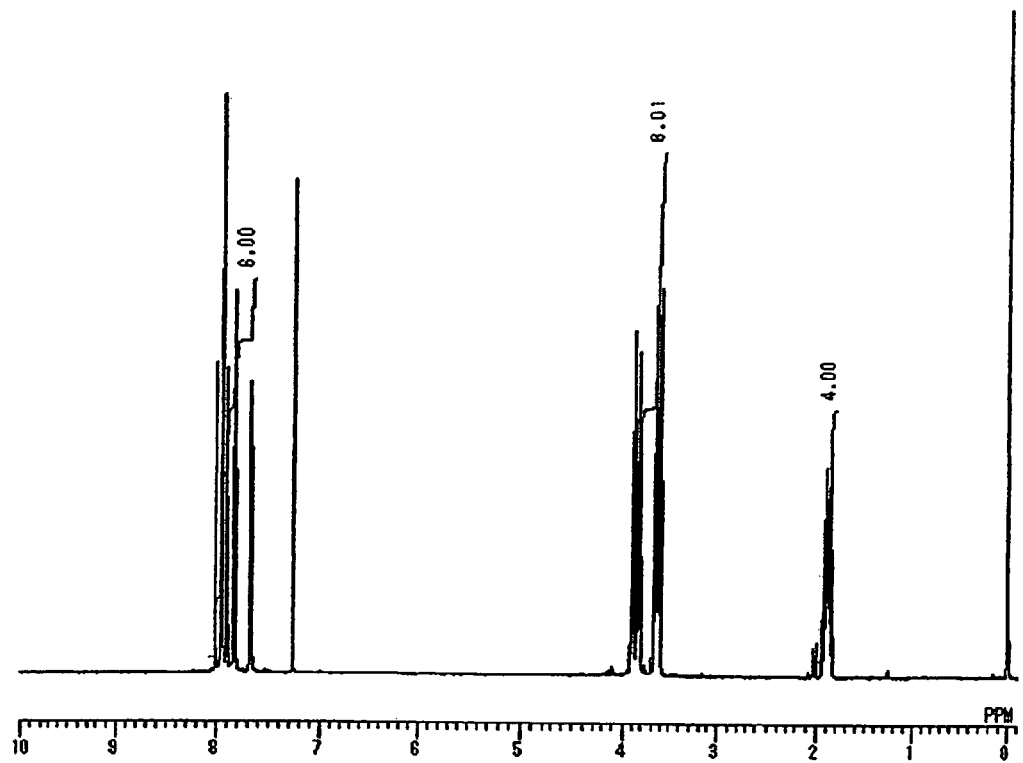
FIG. 1 is $^1$H-NMR spectrum of imide compound A having hydroxyl group at each terminal which was obtained in Synthesis Example 1.

The polyimide resin of the invention can be prepared by reacting a diisocyanate compound of the aforementioned formula (4) and an imide compound of the aforementioned formula (5).

The diisocyanate compound of the formula (4) can be prepared by a diisocyanate compound and a diol compound The diisocyanate compound can be a blocked diisocyanate which is blocked with a blocking agent at the isocyanate group.

The blocking agent can be an alcohol compound, a phenol compound, an active methylene compound, a mercaptan compound, an acid-amide compound, an acid-imide compound, an imidazole compound, a urea compound, an oxime compound, an amine compound, an imine compound, hydrogensulfite, or a pyridine compound. These compounds can be employed singly or in combination. Examples of the blocking agents include alcohol compounds such as methanol, ethanol, propanol, butanol, 2-ethylhexanol, methyl cellosolve, butyl cellosolve, methylcarbitol, benzyl alcohol, cyclohexanol; phenol compounds such as phenol, cresol, ethylphenol, butylphenol, nonylphenol, dinonylphenol, phenol modified with styrene, and hydroxybenzoic esters; active methylene compounds such as dimethyl malonate, diethyl malonate, methyl acetoacetate, ethyl acetoacetate, and acetylacetone; mercaptan compounds such as butylmercaptan and dodecylmercaptan; acid-amide compounds such as acetanilide, acetamide, ε-caprolactam, δ-valerolactam, and γ-butyrolactam; acid-imide compounds such as succinic imide and maleic imide; imidazole compounds such as imidazole and 2-methylimidazole; urea compounds such as urea, thiourea, and ethyleneurea; oxime compounds such as formaldoxime, acetaldoxime, acetoxime, methyl ethyl ketoxime, and cyclohexanone oxime; amine compounds such as diphenylamine, aniline, and carbazole; imine compounds such as ethyleneimine and polyethyleneimine; hydrogensulfites such as sodium hydrogensulfite; and pyridine compounds such as 2-hydroxypyridine and 2-hydroxyquinoline. The carbonate bonding-containing diol compound has the following formula (6):

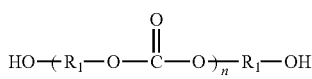
(6)

The carbonate bonding-containing diol compound of the formula (6) is incorporated into the polyimide resin of the invention to impart flexibility to the resin, and hence $R_1$ of the formula (6) preferably is an aliphatic hydrocarbon group. The diol compound of the formula (6) has a molecular weight preferably a number average molecular weight in the range of 500 to 10,000, more preferably in the range of 1,000 to 5,000. Examples of the diol compound of the formula (6) include UH-CARB, UD-CARB AND UC-CARB (all are available from Ube Industries, Ltd.), PLACCEL CD-PL, PLACCEL CD-h (both available from Daicel Chemical Industries, Ltd.), and KURARAY POLYOL C SERIES (available from Kuraray Co., Ltd.). The diol compound of the formula (6) can be employed singly or in combination. Otherwise, the diol compound of the formula (6) can be employed in combination of one or more other diol compounds.

In order to prepare the polyimide resin of the invention, it is preferred that a reactive polar group-containing diol compound is further employed. This diol compound preferably has a substituent group having an active hydrogen atom, such as, a carboxyl group or a phenolic hydroxyl group. Preferred is a diol compound having 1 to 30 carbon atoms (specifically 2 to 20 carbon atoms) which has a carboxyl group or a phenolic hydroxyl group. Examples of the diol compounds having a carboxyl group include 2,2-bis(hydroxymethyl)propionic acid and 2,2-bis(hydroxymethyl)valeric acid. Examples of the diol compounds having a phenolic hydroxyl group include 2,6-bis(hydroxymethyl)phenol and 2,6-bis(hydroxymethyl)-p-cresol. The dial compound having a reactive polar group preferably contains further an epoxy group or an isocyanate compound.

If the diol compound having a reactive polar group is employed in combination with the carbonate bonding-containing diol compound, a molar ratio of the amount of the latter diol compound to the amount of the former diol compound is preferably in the range of 0.1 to 10, more preferably 0.1 to 5. Further, a molar ratio of the amounts of the total diol compounds (i.e., former diol compound+latter diol compound) to the amount of the diisocyanate compound preferably is in the range of 0.5 to 2.5.

The reaction can be carried out in an organic solvent or in the absence of a solvent preferably in an inert gas atmosphere such as nitrogen gas at a temperature in the range of 30 to 150° C., preferably 30 to 120° C., for 1 to 15 hours.

The imide compound of the formula (5) can be prepared by reacting a tetracarboxylic acid compound, a diamine compound, and a monoamine compound having one hydroxyl group. In the formula (5), m is an integer of 0 to 20, preferably 0 to 10, more preferably 0 to 5, most preferably 1 to 5.

The tetracarboxylic acid compound preferably is an aromatic tetracarboxylic acid or an alicyclic tetracarboxylic acid, an acid dianhydride thereof, or an ester with a lower alcohol. Examples of the aromatic tetracarboxylic acids include 2,3,3',4'-biphenyltetracarboxylic acid, 3,3',4,4'-biphenyltetracarboxylic acid, 2,2',3,3'-biphenyltetracarboxylic acid, 3,3',4,4'-diphenylethertetracarboxylic acid, 3,3',4,4'-diphenylsulfonetetracarboxylic acid, 3,3',4,4'-benzophenonetetracarboxylic acid, 2,2-bis(3,4-benzenedicarboxylic acid) hexafluoropropane, pyromellitic acid, 1,4-bis(3,4-benzenedicarboxylic acid)benzene, 2,2-bis [4-(3,4-phenoxydicarboxylic acid)phenyl]2,3,6,7-naphthalenetetracarboxylic acid, 1,2,5,6-naphthalenetetracarboxylic acid, 1,2,4,5-naphthalenetetracarboxylic acid, 1,4,5,8-naphthalenetetracarboxylic acid, and 1,1-bis(2,3-dicarboxyphenyl)ethane. Examples of the alicyclic tetracarboxylic acids include cyclopentanetetracarboxylic acid, 1,2,4,5-cyclohexanetetracarboxylic acid, and 3-methyl-4-cyclohexene-1,2,4,5-tetracarboxylic acid. More preferably, the tetracarboxylic acid is 2,3,3',4'-biphenyltetracarboxylic acid, 3,3',4,4'-diphenylethertetracarboxylic acid, 2,2',3,3'-biphenyltetracarboxylic acid, and acid dianhydrides thereof, and esters thereof with a lower alcohol. The acid dianhydrides are most favorably employed.

The diamine compound can be a diamine compound of any type. Aromatic, alicyclic, or aliphatic diamine can be employed. Examples of the aromatic diamines include aromatic diamines having one benzene ring, such as 1,4-diaminobenzene, 1,3-diaminobenzene, 2,4-diaminotoluene, 1,4-diamino-2,5-dihalogenobenzene; aromatic diamines having two benzene rings, such as bis(4-aminophenyl)-ether, bis(3-aminophenyl)ether, bis(3-aminophenyl)sulfone, bis(4-aminophenyl)methane, bis(3-aminophenyl)-methane, bis(4-aminophenyl)sulfide, bis(3-aminophenyl)-sulfide, 2,2-bis(4-aminophenyl)propane, 2,2-bis(3-aminophenyl)propane, 2,2-bis(4-aminophenyl)hexafluoropropane, o-dianisidine, o-toluidine, and tolidinesulfonic acid; aromatic diamines having three benzene rings, such as 1,4-bis(4-aminophenoxy)benzene, 1,4-bis(3-aminophenoxy)-benzene, 1,4-bis(4-aminophenyl)benzene, 1,4-bis(3-aminophenyl)benzene, α,α'-bis(4-aminophenyl)-1,4-diisopropylbenzene, and α,α'-bis(4-aminophenyl)-1,3-diisopropylbenzene; and aromatic diamines having four benzene rings, such as 2,2-bis[4-(4-aminophenoxy)phenyl]propane, 2,2-bis[4-(4-aminophenoxy)phenyl]hexafluoropropane, 2,2-bis-[4-(4-aminophenoxy)phenyl]sulfone, 4,4'-(4-aminophenoxy)-biphenyl, 9,9-bis(4-aminophenyl)fluorene, and 5,10-bis(4-aminophenyl) anthracene Examples of the alicyclic diamines include isophorone diamine, norbornene diamine, 1,2-diaminocyclohexane, 1,3-diaminocyclohexane, 1,4-diaminocyclohexane, bis(4-aminocyclohexyl)methane, and bis(4-aminocyclohexyl)methane. Examples of the aliphatic diamines include hexamethylene diamine and diaminododecane.

The alicyclic diamine is preferred because the resulting modified polyimide resin is well soluble in solvents, shows high heat resistance, and shows good adhesion to other materials. The alicyclic diamine preferably has 3 to 20 carbon atoms.

The monoamine compound having one hydroxyl group is a compound containing one amino group and one hydroxyl group in its molecular structure. Examples are aliphatic monoamine having 1 to 10 carbon atoms and one hydroxyl group, such as aminoethanol, aminopropanol, and aminobutanol; alicyclic monoamine having 3 to 20 carbon atoms and one hydroxyl group, such as aminocyclohexanol; and aromatic monoamine having 6 to 20 carbon atoms and one hydroxyl group, such as aminophenol, aminocresol, 4-hydroxy-4'-aminodiphenyl ether, 4-hydroxy-4'-aminobiphenyl, aminobenzyl alcohol, and aminophenethyl alcohol.

The reaction for preparing the imide compound of the formula (5) can be conducted by reacting the tetracarboxylic acid compound, the diamine compound, and the monoamine compound having one hydroxyl group in an organic solvent to perform polymerization and imidation. The amine compounds (including the diamine compound and monoamine compound having one hydroxyl group) are used in a molar amount essentially equivalent to a molar amount of the acid anhydride group (or the amount of adjoining two carboxylic group) of the tetracarboxylic acid compound. The reaction is carried out at a temperature of approx. 100° C. or lower, preferably 80° C. or lower, to produce an compound having an amide-acid bonding which has hydroxyl group at each terminal, and the reaction is further continued at a low temperature of approx. 0° C. to 140° C. after addition of an imidation-promoting agent, or at a high temperature of 140° C. to 250° C., so that dehydration-imidation reaction proceeds to give an imide compound having hydroxyl group at each terminal. In the course of the dehydration-imidation reaction, water produced by condensation reaction can be removed by azeotropic distillation with toluene or xylene.

Examples of the organic solvents employable for the production of the imide compound having hydroxyl group at each terminal include amide solvents such as N,N-dimethylformamide, N,N-dimethylacetamide, N-methyl-2-pyrrolidone, and N-methylcaprolactam; sulfur-containing solvents such as dimethyl sulfoxide, hexamethylphosforamide, dimethyl sulfone, tetramethylene sulfone, and dimethyltetramethylene sulfone; phenolic solvents such as cresol, phenol, and xylenol; diglyme solvents such as diethylene glycol dimethyl ether (diglyme), triethylene glycol dimethyl ether (triglyme), and tetraglyme; ketone solvents such as isophorone, cyclohexanone, and 3,3,5-trimethylcyclohexanone; and other organic solvents such as pyridine, ethylene glycol, dioxane, and tetramethylurea. An aromatic hydrocarbon solvent such as benzene, toluene, or xylene can be also employed. The organic solvents can be employed singly or in combination.

The produced imide compound having hydroxyl group at each terminal can be a monomer (in which m of the formula (5) is 0) or an oligomer (in which m of the formula (5) is 1 or more), depending on the molar ratio of the monoamine compound to the diamine compound introduced into the reaction system. The product can be a mixture of the monomer and oligomer, or a mixture of plural oligomers. The mixture can be employed as such or after isolation of the monomer or each oligomer, for manufacturing the desired polyimide resin.

The imide compound having hydroxyl group at each terminal produced in an organic solvent can be employed as such for manufacturing the desired polyimide resin. Otherwise, the imide compound solution can be concentrated or diluted for manufacturing the desired polyimide resin. Otherwise, the imide compound can be isolated from the solution, for example, by incorporating a non-solvent such as water into the imide compound solution. The isolated imide compound can be dried. The dry imide compound can be again dissolved in an appropriate organic polar solvent to give an imide compound solution.

The reaction for preparing the polyimide resin of the invention may be carried out by simultaneously dissolving all of the reactive compounds (i.e., the diisocyanate compound, the carbonate group-containing diol compound or a mixture of the carbonate group-containing diol compound and the reactive polar group-containing diol compound, and the imide compound of the formula (5)) in an organic solvent. However, as is described hereinbefore, it is preferred that the diisocyanate compound first reacts with the carbonate group-containing diol compound or a mixture of the carbonate group-containing diol compound and the reactive polar group-containing diol compound in an organic solvent to produce a divalent isocyanate compound having the aforementioned formula (4).

The divalent isocyanate compound of the formula (4) is then reacted with the imide compound of the formula (5) to produce the desired polyimide resin of the invention.

Examples of the organic solvents employed for the preparation of the modified polyimide resin are the same as those employable for the production of the imide compound having hydroxyl group at each terminal.

The organic solvent is, employed generally in an amount of 30 to 500 weight parts, preferably 60 to 200 weight parts, per 100 weight parts of the imide compound having a hydroxyl group at each terminal.

The resulting modified polyimide resin is present in an organic solvent at a concentration of preferably 3 wt. % or higher, more preferably 5 to 60 wt. %. The polyimide resin solution shows a viscosity (at 25° C., measured by E type rotary viscometer) of preferably 1 to 10,000 Pa·s, more preferably 1 to 600 Pa·s.

The resulting modified polyimide resin has a number-average molecular weight of preferably 3,000 to 50,000, more preferably 4,000 to 40,000, most preferably 4,000 to 30,000.

The modified polyimide resin of the invention can be mixed with an epoxy compound and an organic solvent to give a curable polyimide resin composition of the invention. The epoxy compound is employed in an amount of preferably 1 to 50 weight parts, more preferably 2 to 40 weight parts, most preferably 5 to 35 weight parts, per 100 weight parts of the polyimide resin. The curable polyimide resin composition of the invention can further contain 1 to 50 weight parts (per 100 weight parts of the polyimide resin) of an isocyanate compound. The curable polyimide resin composition of the invention can furthermore contain 1 to 20 weight parts, preferably 1 to 15 weight parts, more preferably 1 to 10 weight parts (per 100 weight parts of the polyimide resin) of a polycarbonate compound having a hydroxyl group at each terminal. The incorporation of the polycarbonate compound is effective to impart to the resulting composition increased adhesion to the molding materials (or sealing materials) employed in the manufacture of an electric-electronic device. The curable polyimide resin composition of the invention can furthermore contain 0.1 to 18 weight parts, preferably 0.3 to 15 weight parts, more preferably 0.5 to 10 weight parts (per 100 weight parts of the modified polyimide resin) of a compound having two or more phenolic hydroxyl groups. The incorporation of the compound having two or more phenolic hydroxyl groups is effective to impart to the resulting composition increased adhesion to the anisotropic conductive material employed in the manufacture of an electric-electronic device.

The epoxy compound preferably is a liquid or solid epoxy resin having an epoxy equivalent in the range of 100 to 4,000 and a molecular weight in the range of 300 to 10,000. Examples of the epoxy compounds employable in the invention include epoxy resins of Bisphenol A type or Bisphenol F type, such as Epikote 806, Epikote 825, Epikote 828, Epikote 1001, Epikote 1002, Epikote 1003, Epikote 1004, Epikote 1055, Epikote 1004AF, Epikote 1007, Epikote 1009, and Epikote 1010 (all available from Japan Epoxy Resin Co., Ltd.); epoxy resins having three or more functional groups, such as Epikote 152, Epikote 154, Epikote 180 series, Epikote 157 series, Epikote 1032 series (all available from Japan Epoxy Resin Co., Ltd.); SUMIEPOXY ELM 100 (available from Sumitomo Chemical Industry Co., Ltd.), EHPE 3150 (available from Daicel Chemical Industries, Ltd.), and MTO0163 (available from CibaGeigy); terminal epoxied oligomer, such as HICAR ETBN 1300×40 (available from Ube Industries, Ltd.), and DENALEX R-45EPT (available from Nagase ChemteX Corporation); epoxied polybutadiene, such as POLYBUTADIENE E-1000-8, E-1800-6.5 (available from Nippon Petrochemical Co., Ltd.) and EPOLEAD PB3600 (available from Daicel Chemical Industries, Ltd.); and alicyclic epoxy resins, such as CELLOXIDE 2021P, CELLOXIDE 2080, EPOLEAD GT400, EHPE (available from Daicel Chemical Industries, Ltd.).

Examples of the polyvalent isocyanate compounds can be blocked) include BARNOCK D-500 (blocked tolylene diisocyanate), BARNOCK D-550 (blocked 1,6-hexamethylene diisocyanate), both available from Dai-Nippon Ink and Chemicals, TAKENATE B-830 (blocked tolylene diisocyanate), TAKENATE B-815N (blocked 4,4'-methylene-bis(cyclohexylisocyanate)), TAKENATE B-842N (blocked 1,3-bis(isocyanatemethyl)cyclohexane), TAKENATE B-846N (blocked 1,3-bis(isocyanatemethyl)cyclohexane), TAKENATE 847N (blocked isophorone diisocyanate), TAKENATE B-882N (blocked 1,6-hexamethylene diisocyanate), all available from Mitsui-Takeda Chemical Co., Ltd., DURANATE MF-B60X (blocked 1,6-hexamethylene diisocyanate), DURANATE MF-K60X (blocked 1,6-hexamethylene diisocyanate), DURANATE ME2-B80 (blocked 1,6-hexamethylene diisocyanate), all available from Asahi Kasei Co., ELASTRON BN-P17 (blocked 4,4'-diphenylmethane diisocyanate), ELASTRON BN-04, ELASTRON BN-08, ELASTRON BN-44, ELASTRON BN-45 (all are blocked urethane-modified polyisocyanates having 3 to 5 functional groups), all available in the form of an aqueous emulsion (the blocked urethane-modified polyisocyanate can be isolated as a dry powder from the aqueous emulsion) from Dai-ichi Kogyo Seiyaku Co., Ltd.

The polycarbonate compound having a hydroxyl group at each terminal has a molecular weight in the range of preferably 500 to 10,000, more preferably 500 to 5,000. Examples of the polycarbonate compounds having a hydroxyl group at each terminal include ENATACOL UH-CARB, UD-CARB, UC-CARB, all available from Ube Industries, Ltd., PLACCEL CD-PL, PLACCEL CH-H, both available from Daicel Company, Ltd., and Kuraray Polyol C available from Kuraray Co., Ltd. The polycarbonate compounds having a hydroxyl group at each terminal can be employed singly or in combination Examples of the compounds having two or more phenolic hydroxyl groups include hydroquinone, 4,4'-dihydroxybiphenyl, and phenol resins such as phenol-novolak and cresol-novolak. Examples of the phenol resins include Phenol-novolak resins H-1, H-2, H-3, H-4, and H-5, Ortho-cresol-novolak resins MER-130 and MEH-7500 of triphenol methane type, MET-7600 of tetrakisphenol type, MEH-7700 of naphthol type, MEH-7800 and MEH-7851 of phenolaralkyl type, R-3 of triphenol type, and MEP-6039 and MEP 6309E of bisphenol-novolak type, and MEH-'8000H, MEH-8005, MEH-8010, MEH-8015, and MEH-82085 of liquid phenol-novolak type. These phenol resins are available from Meiwa Plastic Industries, Ltd.

The polyimide resin composition of the invention can further contain vinyl resins such as polyvinyl ether, polyvinyl acetal and butyral, acrylic resins such as acrylic ester resin and methacrylic ester resin, and glycols such as polyethylene glycol, polypropylene glycol and polytetramethylene glycol. These additives can be included in the polyimide resin composition in an amount of 0.1 to 50 weight parts per 100 weight parts of the modified polyimide resin.

It is preferred that the polyimide resin composition of the invention further contains a curing agent (i.e., curing catalyst) for promoting formation of cross-linkage between the polyimide resin and the epoxy compound or blocked polyvalent isocyanate compound. The curing agent is included preferably in an amount of 0.01 to 25 weight parts, more preferably 0.1 to 15 weight parts, per 100 weight parts of the epoxy compound or blocked polyvalent isocyanate compound. The curing agent can be one of imidazole compounds or tertiary amine compounds. Examples of the imidazole compounds include 2-methylimidazole, 2-ethyl-4-methylimidazole, 2-phenylimidazole, 2-phenyl-4-methylimidazole, and 2,3-dihydro-1H-pyroro[1,2-a]benzimidazole. Examples of the tertiary amine compounds include 1,8-diazabicyclo[5.4.0]-7-undecene (referred to as DBU), N,N-dimethylbenzylamine, N,N,N',N'-tetramethylhexanediamine, triethylenediamine Craw, 2-dimethylaminomethylphenol (DMP-10), 2,4,6-tris(dimethylaminomethyl)phenol (DMP-30), dimorpholino diethyl ether (DMDEE), 1,4-dimethylpiperazine, and cyclohexyldimethylamine.

Examples of the solvents constituting the polyimide resin composition of the invention can be those employed in the method for producing the modified polyimide resin. Preferred examples include nitrogen atom-containing solvents such as N,N-dimethylacetamide, N,N-diethylacetamide, N,N-dimethylformamide, N,N-diethylformamide, N-methyl-2-pyrrolidone, 1,3-dimethyl-2-imidazolidinone, and N-methylcaprolactam; sulfur atom-containing solvents such as dimethyl sulfoxide, diethyl sulfoxide, dimethyl sulfone, diethyl sulfone, and hexamethyl sulforamide; oxygen atom-containing solvents including phenolic solvents such as cresol, phenol, and xylenol, diglyme solvents such as diethylene glycol dimethyl ether (diglyme), triethylene glycol dimethyl ether (triglyme), and tetraglyme, ketone solvents such as acetone, acetophenone, propiophenone, cyclohexanone, and isophorone, ether solvents such as ethylene glycol, dioxane, and tetrahydrofuran, and lactone solvents such as γ-butyrolactone. Most preferred are N-methyl-2-pyrrolidone, dimethyl sulfoxide, N,N-dimethylformamide, N, diethylformamide, N,N-dimethylacetamide, N,N-diethylacetamide, γ-butyrolactone, triethylene glycol dimethyl ether (triglyme) and isophorone.

The organic solvent has a boiling point preferably in the range of 140 to 220°, more preferably higher than 180° C., most preferably higher than 200° C.

Examples of the preferred organic solvents include triglyme (b.p. 216° C.), γ-butyrolactone (b.p. 204° C.), and isophorone (b.p. 213° C.). The organic solvents of the above-mentioned boiling point range shows little volatility so that the screen printing of the solution composition (i.e., ink composition) can be easily carried out. More preferred are γ-butyrolactone and isophorone, because the carbonate bonding-containing compound having a hydroxyl group at each terminal (i.e., the diol compound of the formula (6)) and the imide compound having a hydroxyl group at each terminal (i.e., the imide compound of the formula (5)) are easily soluble in γ-butyrolactone and isophorone. Further, a polyimide composition solution using isophorone as the solvent can be conveniently employed for screen-printing because isophorone absorbs little water and shows a high boiling point and low volatility.

It is preferred that the polyimide resin composition of the invention further contains a fine filler. The fine filler has an average diameter preferably in the range of 0.001 to 15 μm, more preferably 0.005 to 10 μm. Examples of the fine fillers include inorganic fine fillers such as silica micro powder, talc, barium sulfate, and mica, and organic fine fillers such as cross-linked NBR fine powder.

The fine filler is employed in an amount of 5 to 150 weight, parts, preferably 10 to 125 weight parts, per 100 weight parts of the modified polyimide resin. The inorganic filler is preferred. Particularly preferred is a combination of silica micro powder with talc, mica, or barium sulfate. In this case, 1 to 50 weight parts, preferably 5 to 40 weight parts, of the silica micro powder and 5 to 130 weight parts of at least one of talc, mica, and barium sulfate are used per 100 weight parts of the modified polyimide resin. The addition of the fine fillers in such manner is particularly effective to impart good printability and insulation characteristics to the resulting insulation film.

The polyimide resin composition of the invention can further contain 0.1 to 100 weight parts of a pigment such as a colored organic pigment or a colored inorganic pigment, per 100 weight parts of the polyimide resin.

The polyimide resin composition of the invention can further contain an anti-foaming agent and a leveling agent in an amount of 0.1 to 30 weight parts per 100 weight parts of the polyimide resin.

The polyimide resin composition is in the form of a solution composition. The solution composition can be easily prepared by mixing the modified polyimide resin, epoxy compound, and other optional additives in an organic solvent. Otherwise, the epoxy compound and other optional additives can be incorporated into the reaction solution in which the produced polyimide resin is already present. The reaction solution can be employed as such, or after dilution by adding an appropriate organic solvent.

The solution composition (i.e., polyimide resin composition) of the invention has a solution viscosity in the range of generally 5 to 1,000 Pa·s (at 25° C.), preferably 10 to 100 Pa·s, more preferably 10 to 60 Pa·s, because the solution composition having a solution viscosity in the above-mentioned range can be conveniently employed as an ink composition for the use in screen printing and can give a cured insulation film having good characteristics.

The polyimide resin composition of the invention can be favorably employed for the formation of an insulation film (i.e., protection film) on an electric-electronic device on which chip elements such as IC chips are mounted.

For instance, the polyimide resin composition is coated on a surface of an electro-conductive metal film having a wiring pattern arranged on an insulation sheet to form a resin composition layer of 3 to 60 μm thick (thickness after dryness) by screen printing. Thus formed resin composition layer is then heated at 50 to 100° C. for 5 to 60 minutes for removing the solvent and subsequently heated at 100 to 210° C., preferably 110 to 200° C., for 5 to 120 minutes, preferably 10 to 60 minutes for curing the resin composition, so that a cured polyimide resin composition film (i.e., insulation film) having a modulus of elasticity in the range of 10 to 500 MPa can be produced. Thus produced insulation film shows high flexibility, high bendability, high heat-resistance, high resistance to warping, high resistance to soldering, high resistance to chemical materials, high resistance to solvents (e.g., acetone, isopropanol, methyl ethyl ketone, and N-methyl-2-pyrrolidone), good adhesion to an electroconductive metal, a substrate and a molding material, and good electric characteristics.

It also is advantageous that the polyimide resin composition of the invention can be cured at a relatively low temperature such as in the range of 50 to 210° C., particularly 60 to 160° C., to give an insulation film having satisfactory characteristics. Accordingly, the polyimide resin composition of the invention can be utilized as an interlayer adhesive to combine adjoining substrates of multi-layered wiring board.

The present invention is further described by the following examples.

In the following examples, the physical data and other properties were determined by the below-mentioned methods.

[$^1$H-NMR Spectrum]

The $^1$H-NMR spectrum was obtained in a deuterated dimethyl sulfoxide or a deuterated chloroform by means of a nuclear magnetic spectrometer (AL-300, available from JEOL, Ltd.).

[Solution Viscosity]

The solution viscosity was determined at 25° C. and 10 rpm (rotation), by means of a viscometer TV-20 (available from Tohki Sangyo Co., Ltd.).

[GPC]

The number-average molecular weight was determined in tetrahydrofuran by means of LC-10 (GPC column KF-80Mx2, Kf-802, available from Shimazu Corporation, Ltd.). The polystyrene standard was used.

[Modulus in Tension]

A polyimide resin composition was cured to give a cured sheet having a thickness of approx. 100 μm. The cured sheet was cut to give a test piece (width: 1 cm, length: 7 cm). The test piece was subjected to the measurement of modulus in tension at 25° C., 50% RH, and at a cross-head speed of 50 mm/min., and a space between chucks of 5 cm.

[Evaluation of Insulation]

A circuit board composed of a polyimide film (thickness: 25 μm) and a copper film (thickness: 9 μm) on which a comb circuit pattern of 20 μm/20 μm (line/space) was formed was prepared. The modified polyimide composition was coated on the circuit pattern, and heated first to 80° C. for 30 minutes and second to 120° C. for 90 minutes to give a cured insulation film. A bias voltage of 60 V was applied to the insulation film under high temperature-high humidity condition (85° C., 85% RH), and the electric resistance after 100 hours is measured.

[Evaluations of Cured Insulation Film]

The polyimide resin composition was coated on a glossy surface of an electrolytic copper film (thickness: 35 μm) to give a coated layer of approx. 50 μm. The coated polyimide resin composition layer was heated first to 80° C., 30 minutes and second to 120° C. for 90 minutes for curing to give a cured insulation film of approx. 20 μm thick.

The resulting insulation film is then subjected to the tests for adhesion to sealing material, bendability, resistance to soldering, and resistance to organic solvents. The details are set forth below.

(1) Adhesion to Molding Material

An IC chip molding material CEL-C-5020 (sealing material, available from Hitachi Chemical Co., Ltd.)'was dropped on the cured insulation film to give a circular layer (thickness: approx. 1 mm, diameter: approx. 0.5 cm). The circular layer was then heated to 150° C. for one hour for curing.

The test sample having the cured molding material layer was manually bent and observed to examine if any separations occurred in the constitutional layers. If the separation occurred in the insulation film due to cohesive failure or between the copper film and the insulation film, "pass" was marked. Otherwise, "failure" was marked.

(2) Bendability

The cured insulation film was reversely bent and the bent area was observed. If no change was observed, "pass" was marked. If there were cracks in the bent area, "failure" was marked.

(3) Resistance to Soldering

A rosin wax (SUNFLUX SF-270, available from Sanwa Chemical Industry Co., Ltd.) was coated on the cured insulation film. The coated insulation film was then brought into contact with a soldering bath (heated to 260° C.) for 10 seconds. Thus treated insulation film was observed. If no change was observed on the insulation film, "good" was marked. If certain coarse surface was observed on the insulation film, "pass" was marked. If the insulation film was melted or deformed, "failure" was marked.

(4) Resistance to Solvents

The insulation film on the copper film was immersed in acetone at 25° C. for one hour, and the free surface of the insulation film was rubbed with a cotton bar applicator in which acetone was absorbed, under the conditions of a load of 300 to 500 g and a rubbing angle of 45°, until the copper surface was exposed. The number of the rubbing until the copper surface was exposed was recorded.

[Evaluation on Resistance to High Temperature-High Humidity—Pressure Cooker Test (Pct)]

The modified polyimide resin composition was coated over a rough surface of an electrolytic copper film (thickness: 35 μm) to give a composition film of approx. 50 μm thick. The composition film was heated first to 80° C. for 30 minutes and second to 160° C. for 60 minutes, to give an insulation film of 20 μm thick. The insulation film was subjected to Pressure Cooker Test (121° C., 100% RH, 100 hours). Thus treated insulation film was then observed. An insulation film showing no change was marked "pass", while an insulation showing color change was marked "failure".

The compounds, epoxy resins, curing agent and additives employed in the examples are described below.

[Tetracarboxylic Acid Compound]
  2,3,3',4'-biphenyltetracarboxylic dianhydride
  3,3',4,4'-diphenylsulfonetetracarboxylic dianhydride
[Diamine Compound]
  isophorone diamine
[Amino Alcohol]
  3-aminopropanol
[Diol Having a Reactive Polar Group]
  2,2-bis(hydroxymethyl)propionic acid
[Polycarbonate Having a Hydroxyl Group at Each Terminal]
  KURARAY POLYOL C-2015 (mean molecular weight: 2,000, available from Kuraray Co., Ltd.)
[Diisocyanate Compound]
  4,4'-diphenylmethane diisocyanate
[Solvent]
  dimethylacetamide
  toluene
  isophorone
  γ-butyrolactone
[Epoxy Resin]
  EPOLEAD PB 3600 (epoxy equivalent: 194, available from Daicel Corporation, Ltd.)
  CELLOXIDE 2021P (epoxy equivalent: 126, available from Daicel Chemical Industries, Ltd.)

[Blocked Polyisocyanate Compound]
  BARNOCK D-550 (blocked 1,6-hexamethylene diisocyanate, blocking agent: methyl ethyl ketoxime, available from Dai-Nippon Ink and Chemicals)
  TAKENATE B 830 (available from Mitsui-Takeda Chemical Company, Ltd.)
  DURANATE ME 20-B80E (available, from Asahi Kasei Co.)
[Phenolic Resin]
  H-1 (phenol-novolak, available from Meiwa Plastic Industries, Ltd.)
  H-3 (phenol-novolak, available from Meiwa Plastic Industries, Ltd.)
  MEH-7851 (phenol-novolak, available from Meiwa Plastic Industries, Ltd.)
[Curing Agent]
  2-ethyl-4-methylimidazole
  1,8-diazabicyclo[5.4.0]-7-undecene
[Silica Micro Powder]
  AEROSIL 50 (BET surface area: 50 $m^2/g$, available from Nippon Aerosil Co., Ltd.)
  AEROSIL 130 (BET surface area: 130 $m^2/g$, available from Nippon Aerosil Co., Ltd.)
  AEROSIL R972 (BET surface area: 110 $m^2/g$, available from Nippon Aerosil Co., Ltd.)
[Talc]
  SG 200 (mean size: 1.0 μm, available from Japan Talc Co., Ltd.)
  SG 95 (available from Japan Talc Co., Ltd.)

SYNTHESIS EXAMPLE 1

Preparation of Imide Compound A Having Hydroxyl Group at Each Terminal

In a 500 mL-volume glass separable flask equipped with a nitrogen gas inlet, a Dean-Stark receiver, and a cooler were placed 58.8 g (0.20 mol) of 2,3,3',4'-biphenyltetracarboxylic dianhydride, 30 g (0.40 mol) of 3-aminopropanol, and 200 mL of dimethylacetamide. The compounds were stirred at 100° C. for one hour in a nitrogen gas atmosphere. To the mixture was added 50 mL of toluene, and the resulting mixture was heated at 180° C. for 4 hours, while water produced in the course of imidation reaction was removed together with toluene by azeotropic distillation. The reaction mixture was poured into 2 L of water, and the resulting precipitate was collected by filtration, washed with water, and dried under reduced pressure, to obtain 43.16 g of an imide compound in the form of powder. $^1$H-NMR spectrum of the imide compound is shown in FIG. 1. From the $^1$H-NMR spectrum, it is confirmed that the imide compound is an imide compound having hydroxyl group at each terminal (m in formula (5) is 0).

SYNTHESIS EXAMPLE 2

Preparation of Imide Compound B Having Hydroxyl Group at Each Terminal

Figure 2:
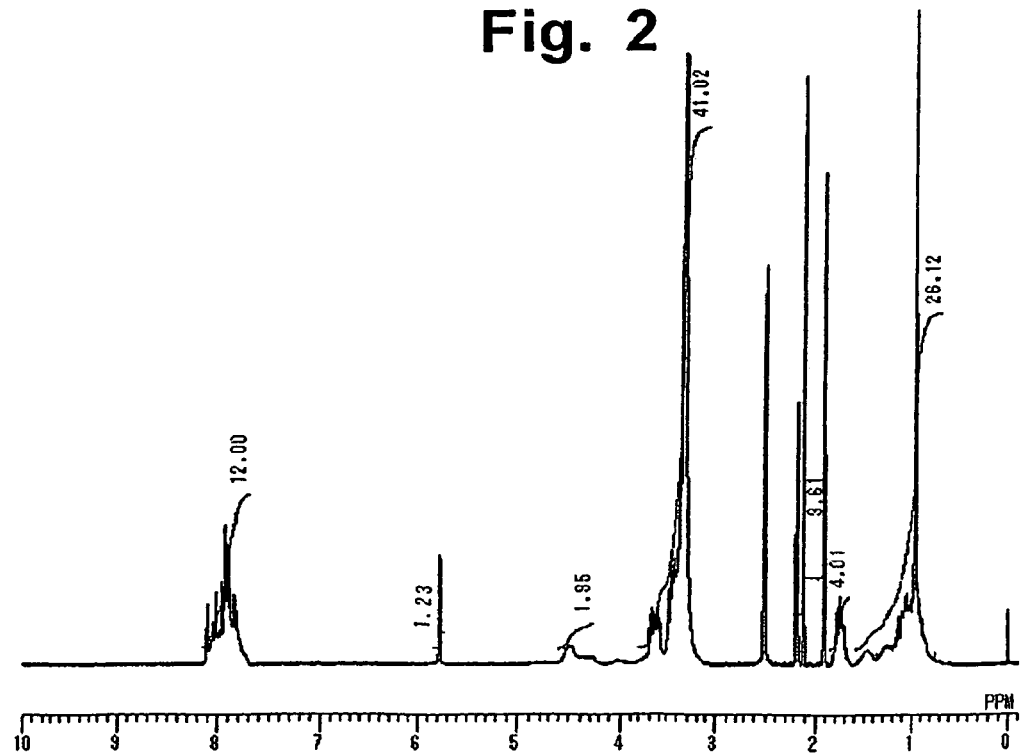
FIG. 2 is $^1$H-NMR spectrum of imide compound B having hydroxyl group at each terminal which was obtained in Synthesis Example 2.

In a 500 mL-volume glass separable flask equipped with a nitrogen gas inlet, a Dean-Stark receiver, and a cooler were placed 58.8 g (0.20 mol) of 2,3,3',4'-biphenyltetracarboxylic dianhydride, 17.0 g (0.10 mol) of isophorone diamine, 15.0 g (0.20 mol) of 3-aminopropanol, and 200 mL of dimethylacetamide. The compounds were stirred at 100° C. for one hour in a nitrogen gas atmosphere. To the mixture was added 50 mL of toluene, and the resulting mixture was heated at 180° C. for 4 hours, while water produced in the course of imidation reaction was removed together with toluene by azeotropic distillation. The reaction mixture was poured into 2 L of water, and the resulting precipitate was collected by filtration, washed with water, and dried under reduced pressure, to obtain 78.8 g of an imide compound in the form of powder. $^1$H-NMR spectrum of the imide compound is shown in FIG. 2. From a ratio of integral strength of a peak assignable to 2-position methylene proton of propanol (1.65-1.85 ppm) and a peak assignable to phenylene proton of biphenyltetracarboxylic imide (7.50-8.20 ppm) observed in the $^1$H-NMR spectrum of FIG. 2, it is confirmed that the imide compound is an imide compound having hydroxyl group at each terminal (m in formula (5) is 1 (average)), that is, an imide oligomer having hydroxyl group at each terminal.

SYNTHESIS EXAMPLE 3

Preparation of Imide Compound C Having Hydroxyl Group at Each Terminal

Figure 3:
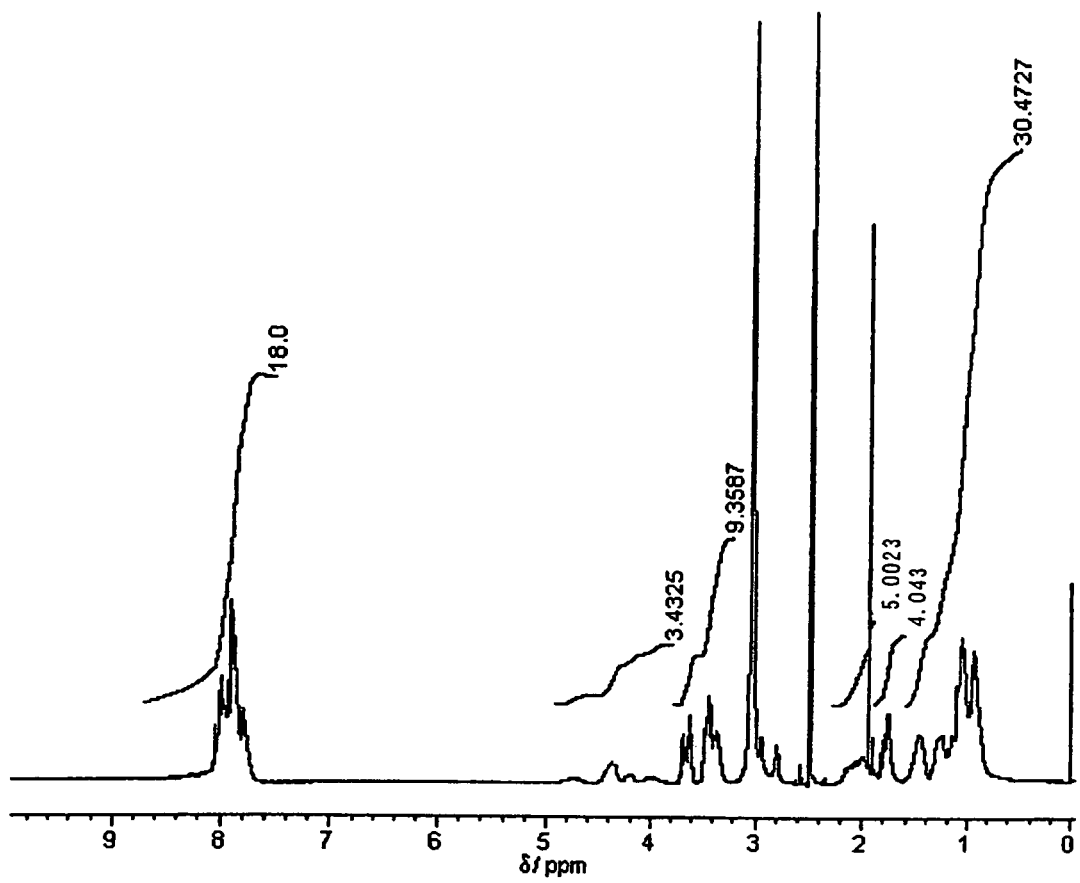
FIG. 3 is $^1$H-NMR spectrum of imide compound C having hydroxyl group at each terminal which was obtained in Synthesis Example 3.

In a 500 mL-volume glass separable flask equipped with a nitrogen gas inlet, a Dean-Stark receiver, and a cooler were placed 58.8 g (0.20 mol) of 2,3,3',4',-biphenyltetracarboxylic dianhydride, 25.55 g (0.15 mol) of isophorone diamine; 7.51 g (0.1 mol) of 3-aminopropanol, and 200 mL of dimethylacetamide. The compounds were stirred at 100° C. for one hour in a nitrogen gas atmosphere. To the mixture was added 50 mL of toluene, and the resulting mixture was heated at 180° C. for 4 hours, while water produced in the course of imidation reaction was removed together with toluene by azeotropic distillation. The reaction mixture was poured into 2 L of water, and the resulting precipitate was collected by filtration, washed with water, and dried under reduced pressure, to obtain 72.0 g of an imide compound in the form of powder. $^1$H-NMR spectrum of the imide compound is shown in FIG. 3. From a ratio of integral strength of a peak assignable to 2-position methylene proton of propanol (1.65-1.85 ppm) and a peak assignable to phenylene proton of biphenyltetracarboxylic imide (7.50-8.20 ppm) observed in the $^1$H-NMR spectrum of FIG. 3, it is confirmed that the imide compound is an imide compound having hydroxyl group at each terminal (m in formula (5) is 3 (average)), that is, an imide oligomer having hydroxyl group at each terminal.

EXAMPLE 1

(1) Preparation of Modified Polyimide Resin

In a 300 mL-volume glass flask equipped with a nitrogen gas inlet were placed 29.94 g (15.00 mmol) of KURARAY POLYOL C-2015, 1.01 g (7.50 mmol) of 2,2-bis(hydroxymethyl)propionic acid, 8.53 g (34.09 mmol) of 4,4'-diphenylmethane diisocyanate, and 13.7 g of isophorone. The compounds were stirred at 80° C. for 1.5 hours in a nitrogen gas atmosphere. To the mixture were added 6.13 g (15.00 mmol) of the imide compound A prepared in Synthesis Example 1 and 31.9 g of isophorone. The resulting mixture was then stirred at 80° C. for 1.5 hours to give a polyimide resin solution. Thus produced polyimide resin solution had a polymer concentration of 50 wt. %, and a solution viscosity of 61 Pa·s. The number-average molecular weight of the polyimide resin determined by GPC was 26,000. The polyimide resin solution was then diluted with isophorone, to give a clear, stable polyimide resin solution having a polymer concentration of 40 wt. %.

(2) Evaluation of Modified Polyimide Resin

In a glass vessel were placed the polyimide resin solution obtained as above, 10 weight parts (per 100 weight parts of the polyimide resin) of an epoxy resin (PB 3600), 20 weight parts of a blocked isocyanate (D 550), and 0.8 weight part of an amine curing agent (2E4MZ). The compounds were stirred and uniformly mixed. To the resulting solution were added 10 weight parts of AEROSIL 130 and 5 weight parts of AEROSIL 50, and the resulting mixture was stirred and kneaded to give a polyimide resin composition. The polyimide resin composition was then subjected to measurement of its viscosity by means of a rotary viscometer.

A film produced from the resulting polyimide resin composition was evaluated in terms of modulus in tension, electric insulation, adhesion to molding material, bendability, resistance to soldering, resistance to solvents, and PCT performance. The results are set forth in Table 1.

EXAMPLE 2

(1) Preparation of Modified Polyimide Resin

In a 300 mL-volume glass flask equipped with a nitrogen gas inlet were placed 10.0 g (5.01 mmol) of KURARAY POLYOL C-2015, 0.168 g (1.25 mmol) of 2,2-bis(hydroxymethyl)propionic acid, and 2.56 g (10.25 mmol) of 4,4'-diphenylmethane diisocyanate. The compounds were stirred at 80° C. for 1.5 hours in a nitrogen gas atmosphere. To the mixture were added 4.19 g (5.01 mmol) of the imide compound B prepared in Synthesis Example 2 and 25.38 g of isophorone. The resulting mixture was then stirred at 80° C. for 1.5 hours, to give a clear, stable polyimide resin solution. Thus produced polyimide resin solution had a polymer concentration of 40 wt. %, and a solution viscosity of 24 Pa·s. The number-average molecular weight of the polyimide resin determined by GPC was 6,400.

(2) Evaluation of Modified Polyimide Resin

The procedures of Example 1-(2) were repeated to prepare a film for the various evaluations. The results are set forth in Table 1.

EXAMPLE 3

Preparation of Modified Polyimide Resin

In a 300 mL-volume glass flask equipped with a nitrogen gas inlet were placed 10.0 g (5.01 mmol) of KURARAY POLYOL C-2015, 0.336 g (2.51 mmol) of 2,2-bis(hydroxymethyl)propionic acid, and 2.85 g (11.39 mmol) of 4,4'-diphenylmethane diisocyanate. The compounds were stirred at 80° C. for 1.5 hours in a nitrogen gas atmosphere. To the mixture were added 4.19 g (5.01 mmol) of the imide compound B prepared in Synthesis Example 2 and 26.07 g of isophorone. The resulting mixture was then stirred at 80° C. for 1.5 hours, to give a clear, stable polyimide resin solution. Thus produced polyimide resin solution had a polymer concentration of 40 wt. %, and a solution viscosity of 29 Pa·s. The number-average molecular weight of the polyimide resin determined by GPC was 6,500.

(2) Evaluation of the Modified Polyimide Resin

The procedures of Example 1-(2) were repeated to prepare a film for the various evaluations. The results are set forth in Table 1.

EXAMPLE 4

Preparation of Modified Polyimide Resin

In a 300 mL-volume glass flask equipped with a nitrogen gas inlet were placed 50.00 g (25 mmol) of KURARAY POLYOL C-2015, 3.35 g (25 mmol) of 2,2-bis(hydroxymethyl)propionic acid, 15.64 g (62.5 mmol) of 4,4'-diphenylmethane diisocyanate, and 69.76 g of γ-butyrolactone. The compounds were stirred at 60° C. for 3.5 hours in a nitrogen gas atmosphere. To the mixture were added 20.92 g (25 mmol) of the imide compound B prepared in Synthesis Example 2 and 20.92 g of γ-butyrolactone. The resulting mixture was then stirred at 80° C. for 10 hours, to give a polyimide solution. Thus produced polyimide resin solution had a polymer concentration of 55 wt. %, and a solution viscosity of 490 Pa·s. The number-average molecular weight of the polyimide resin determined by GPC was 6,800.

(2) Evaluation of Modified Polyimide Resin

In a glass vessel were placed the polyimide resin solution obtained as above, 10 weight parts (per 100 weight parts of the polyimide resin) of the epoxy resin (CELLOXIDE 2021P), 30 weight parts of the blocked isocyanate (ME 20-B), 15 weight parts of TAKENATE B830, weight parts of a phenol resin (MEH-7851), and 1 weight part of a curing agent (DBU). The compounds were stirred and uniformly mixed. To the resulting solution were added 7 weight parts of AEROSIL R972 and 5 weight parts of talc (SG 2000), and the resulting mixture was stirred and kneaded to give a polyimide resin composition. The polyimide resin composition was then subjected to measurement of its viscosity by means of a rotary viscometer.

A film produced from the resulting polyimide resin composition was evaluated in the same manner as in Example 1-(2). The results are set forth in Table 1.

EXAMPLE 5

(1) Preparation Of Modified Polyimide Resin

In a 300 mL-volume glass flask equipped with a nitrogen gas inlet were placed 25.00 g (12.5 mmol) of KURARAY POLYOL C-2015, 0.43 g (3.15 mmol) of 2,2-bis(hydroxymethyl)propionic acid, 6.38 g (25.5 mmol) of 4,4'-diphenylmethane diisocyanate, and 31.8 g of γ-butyrolactone. The compounds were stirred at 60° C. for 3.5 hours in a nitrogen gas atmosphere. To the mixture were added 38.94 g (23 mmol) of the imide compound C prepared in Synthesis Example 3 and 58.3 g of γ-butyrolactone. The resulting mixture was then stirred at 80° C. for 10 hours. Thus produced polyimide resin solution had a polymer concentration of 44 wt. %, and a solution viscosity of 31 Pa·s. The number-average molecular weight of the polyimide resin determined by GPC was 5,200.

(2) Evaluation of Modified Polyimide Resin

In a glass vessel were placed the polyimide resin solution obtained as above, 10 weight parts (per 100 weight parts of the polyimide resin) of the epoxy resin (EPOLEAD PB3600), 30 weight parts of the blocked isocyanate (BARNOCK D-550), 15 weight parts of TAKENATE B830, 10 weight parts of a phenol resin (H-1), and 0.8 weight part of a curing agent (2E4MZ). The compounds were stirred and uniformly mixed. To the resulting solution were added 7 weight parts of AEROSIL 8972 and 5 weight parts of talc (SG 95), and the resulting mixture was stirred and kneaded to give a polyimide resin composition. The polyimide resin composition was then subjected to measurement of its viscosity by means of a rotary viscometer.

A film produced from the resulting polyimide resin composition was evaluated in the same manner as in Example 1-(2). The results are set forth in Table 1.

COMPARISON EXAMPLE 1

For Example 1 of JP-A-2002-145981

(1) Preparation of Modified Polyimide Resin

In a 5 L-volume glass flask equipped with a nitrogen gas inlet were placed 1000.0 g of a polycarbonate diol compound of 1,6-hexanediol type and 250.27 g of 4,4'-diphenylmethane diisocyanate, and 833.51 g of γ-butyrolactone, and the mixture was heated to 140° C. The mixture was kept at 140° C. for 5 hours for performing reaction. To the reaction mixture were added 358.29 g of 3,3',4,4'-diphenylsulfonetetracarboxylic dianhydride, 125.14 g of 4,4'-diphenylmethane diisocyanate, and 584.97 g of γ-butyrolactone, and the mixture was heated to 160° C. The mixture was kept at 160° C. for 5 hours for performing reaction, to give a modified polyimide solution. The viscosity was 400 Pa·s.

The resulting polyimide solution was slightly turbid and turned into a gel solution within one day.

TABLE 1

| Example | Viscosity (Pa·s) | Modulus of elasticity | Electric insulation (Ω) |
|---|---|---|---|
| Ex. 1 | 25 | 14 | $6 \times 10^{10}$ |
| Ex. 2 | 35 | 134 | $1 \times 10^{11}$ |
| Ex. 3 | 37 | 220 | $1 \times 10^{11}$ |
| Ex. 4 | 48 | 430 | $3 \times 10^{10}$ |
| Ex. 5 | 49 | 710 | $1 \times 10^{11}$ |

Remarks: All modified polyimide resin showed good performance (i.e., pass) in the tests for adhesion to molding material, bendability, resistance to soldering, resistance to organic solvent (>50), and PCT.

EXAMPLE 6

The procedures of Example 1-(1) were repeated except that no 2,2-bis(hydroxymethyl)propionic acid was used and KURARAY POLYOL C-2015 was used in an amount of 22.5 mmol, to give a polyimide resin solution. Thus prepared polyimide resin solution was clear and stable.

The invention claimed is:

1. A polyimide resin comprising the following recurring units (1), (2) and (3);

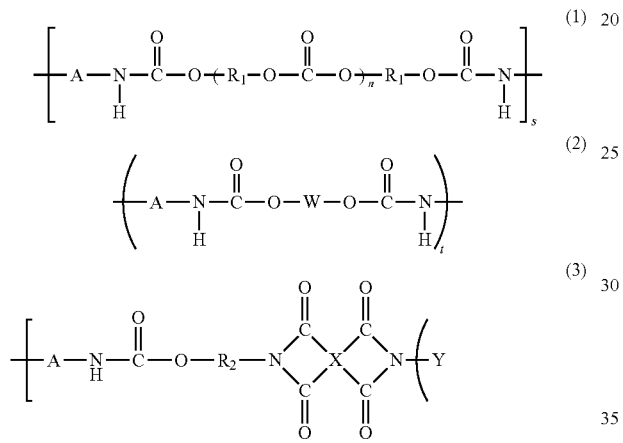

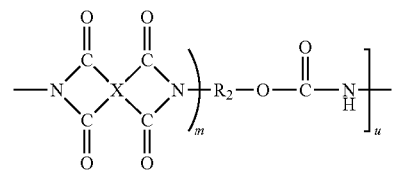

in which A is a divalent residue obtainable from a diisocyanate compound by removing two isocyanate groups thereof; W is a divalent residue obtainable from a diol compound having a carboxyl group by removing two hydroxyl groups thereof; $R_1$ is a divalent aliphatic or aromatic hydrocarbon group and $R_2$ is a divalent aliphatic hydrocarbon group;

X is a tetravalent residue obtainable from a tetracarboxylic acid compound by removing all carboxyl groups thereof; Y is a divalent group obtainable from a diamine compound by removing two amino groups thereof; n is an integer of 1 to 40, m is an integer of 1 to 20, each of s and u independently is an integer of 1 to 100, and t is an integer of 1 to 100.

2. The polyimide resin of claim 1, wherein the A is a divalent aliphatic, alicylic or aromatic hydrocarbon group having 2 to 30 carbon atoms.

3. The polyimide resin of claim 1, wherein the tetracarboxylic acid compound is an aromatic tetracarboxylic acid or a dianhydride thereof.

4. The polyimide resin of claim 1, wherein the diamine compound is an aromatic, alicyclic, or aliphatic diamine.

5. The polyimide resin of claim 1, wherein s and t satisfy the following conditions:

$$t/s = 0.1\text{-}10$$

$$(s+t)/p = 0.5\text{-}2.5$$

wherein p is a molar amount of the diisocyanate compound.

6. A method for preparing a polyimide resin of claim 1, which comprises reacting a diisocyanate compound of the formula (4) and an imide compound of the formula (5):

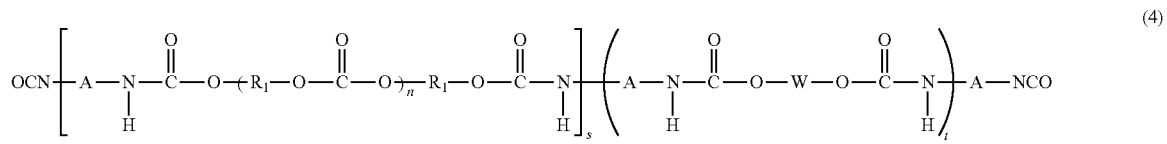

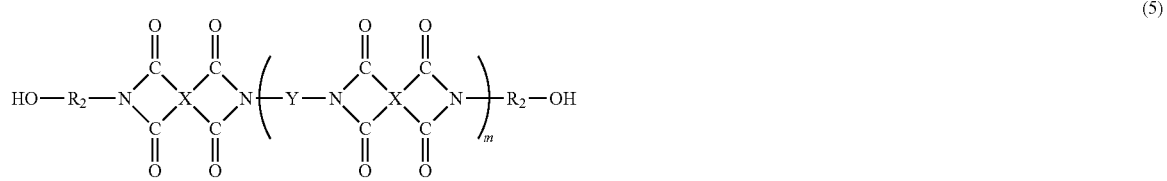

in which each of A, W, $R_1$, $R_2$, n, s and t has the same meaning as defined above.

7. A curable polyimide resin composition comprising 100 weight parts of the polyimide resin of claim 1, 1 to 50 weight parts of an epoxy compound or an isocyanate compound, and an organic solvent.

8. A cured insulation film manufactured by heating a solution film of the polyimide resin composition which comprises 100 weight parts of the polyimide resin of claim 1, 1 to 50 weight parts of an epoxy compound or an isocyanate compound, and an organic solvent.

9. The polyimide resin of claim 1, wherein Y is a divalent group obtainable from an alicyclic diamine by removing two amino groups thereof.

10. The polyimide resin of claim 1, wherein X is a tetravalent residue obtainable from 2,3,3',4'-biphenyltetracarboxylic acid by removing all carboxyl groups thereof.

\* \* \* \* \*